(12) United States Patent
Kiyosawa et al.

(10) Patent No.: US 10,355,091 B2
(45) Date of Patent: Jul. 16, 2019

(54) SEMICONDUCTOR DEVICE AND METHOD FOR MANUFACTURING THE SAME

(71) Applicant: PANASONIC INTELLECTUAL PROPERTY MANAGEMENT CO., LTD., Osaka (JP)

(72) Inventors: Tsutomu Kiyosawa, Toyama (JP); Atsushi Ohoka, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/221,109

(22) Filed: Dec. 14, 2018

(65) Prior Publication Data

US 2019/0123147 A1  Apr. 25, 2019

Related U.S. Application Data

(62) Division of application No. 15/911,236, filed on Mar. 5, 2018, now Pat. No. 10,211,293.

(30) Foreign Application Priority Data

Mar. 24, 2017  (JP) ................................. 2017-058779

(51) Int. Cl.
*H01L 29/16* (2006.01)
*H01L 29/32* (2006.01)
(Continued)

(52) U.S. Cl.
CPC .......... *H01L 29/1608* (2013.01); *H01L 22/12* (2013.01); *H01L 29/0619* (2013.01);
(Continued)

(58) Field of Classification Search
CPC ................. H01L 29/1608; H01L 22/20; H01L 29/41741; H01L 29/32; H01L 29/872;
(Continued)

(56) References Cited

U.S. PATENT DOCUMENTS 7,535,056 B2  5/2009  Komachi
8,704,292 B2  4/2014  Disney
(Continued)

FOREIGN PATENT DOCUMENTS

JP  4026312 B2  12/2007

OTHER PUBLICATIONS

Notice of Allowance issued in U.S. Appl. No. 15/911,236, dated Nov. 30, 2018.

*Primary Examiner* — Savitri Mulpuri
(74) *Attorney, Agent, or Firm* — McDermott Will & Emery LLP

(57) ABSTRACT

Semiconductor device includes semiconductor substrate, drift layer, first electrode, and second electrode. Semiconductor substrate is of a first conductivity type and is formed of a silicon carbide semiconductor, a gallium nitride semiconductor, or the like. For example, semiconductor substrate is an n-type silicon carbide semiconductor substrate. Drift layer is an epitaxial semiconductor layer of the first conductivity type which is formed on upper surface of semiconductor substrate by epitaxial growth. Drift layer is formed of, for example, an n-type silicon carbide semiconductor. Drift layer has a thickness of t. For example, the thickness t is between about 5 μm and about 100 μm (inclusive).

3 Claims, 15 Drawing Sheets

(51) Int. Cl.

| | | |
|---|---|---|
| *H01L 29/872* | (2006.01) | |
| *H01L 29/08* | (2006.01) | |
| *H01L 29/10* | (2006.01) | |
| *H01L 29/66* | (2006.01) | |
| *H01L 29/06* | (2006.01) | |
| *H01L 29/417* | (2006.01) | |
| *H01L 21/66* | (2006.01) | |
| *H01L 29/78* | (2006.01) | |
| *H01L 21/02* | (2006.01) | |
| *H01L 21/04* | (2006.01) | |

(52) U.S. Cl.
CPC ...... *H01L 29/0696* (2013.01); *H01L 29/0865* (2013.01); *H01L 29/1095* (2013.01); *H01L 29/32* (2013.01); *H01L 29/41741* (2013.01); *H01L 29/66068* (2013.01); *H01L 29/66143* (2013.01); *H01L 29/66712* (2013.01); *H01L 29/7802* (2013.01); *H01L 29/872* (2013.01); *H01L 21/02378* (2013.01); *H01L 21/02529* (2013.01); *H01L 21/02634* (2013.01); *H01L 21/0465* (2013.01)

(58) Field of Classification Search
CPC ................. H01L 29/7802; H01L 22/12; H01L 29/66143; H01L 29/66712; H01L 29/0696; H01L 29/0619; H01L 29/66068; H01L 29/1095; H01L 21/0465; H01L 21/02378; H01L 21/02529; H01L 21/02634; H01L 29/66; H01L 29/78; H01L 29/16

See application file for complete search history.

(56) References Cited

U.S. PATENT DOCUMENTS

| | | |
|---|---|---|
| 8,741,707 B2 | 6/2014 | Disney et al. |
| 9,368,650 B1 | 6/2016 | Yen et al. |
| 9,496,344 B2 | 11/2016 | Tanaka et al. |
| 9,728,654 B2 | 8/2017 | Higashida |
| 9,825,126 B2 | 11/2017 | Hatta et al. |
| 2009/0194786 A1 | 8/2009 | Iwamoto et al. |
| 2012/0056202 A1 | 3/2012 | Wada et al. |
| 2014/0252463 A1 | 9/2014 | Darwish et al. |
| 2015/0041887 A1 | 2/2015 | Soeno et al. |
| 2016/0197143 A1 | 7/2016 | Naito |
| 2016/0351667 A1 | 12/2016 | Wada et al. |

SEMICONDUCTOR DEVICE AND METHOD FOR MANUFACTURING THE SAME

CROSS-REFERENCE OF RELATED APPLICATIONS

This application a Divisional application of U.S. patent application Ser. No. 15/911,236, filed on Mar. 5, 2018, which in turn claims the benefit of Japanese Application No. 2017-058779, filed on Mar. 24, 2017, the entire disclosures of which Applications are incorporated by reference herein.

BACKGROUND

1. Technical Field

The present disclosure relates to a semiconductor device and a method for manufacturing the semiconductor device.

2. Description of the Related Art

In recent years, the development of semiconductor devices for power electronics applications has been promoted. Power semiconductor devices have large-area semiconductor chips, and these large-area semiconductor chips are apt to contain defects. This decreases the yield of the semiconductor devices. To address this problem, various traditional technologies have been presented to prevent the defects from causing a reduction in yield, as is disclosed in PTL 1.

CITATION LIST

Patent Literature

PTL 1; Japanese Patent No. 4026312

SUMMARY

The present disclosure provides a new technology that prevents defects from causing a reduction in yield.

A semiconductor device of the present disclosure includes a semiconductor substrate, a drift layer, a first electrode, and a second electrode. The drift layer is on a surface of the semiconductor substrate. The first electrode is in a region, on a surface of the drift layer, except a depletion control region and has an ohmic contact or a Schottky contact with the drift layer. The second electrode has an ohmic contact with a rear surface of the semiconductor substrate. The drift layer has a thickness of t. The depletion control region includes a circular or sector-shaped region having a radius of not less than t.

The technique provided by the present disclosure prevents a defect from causing a reduction in yield.

Figure 1A:
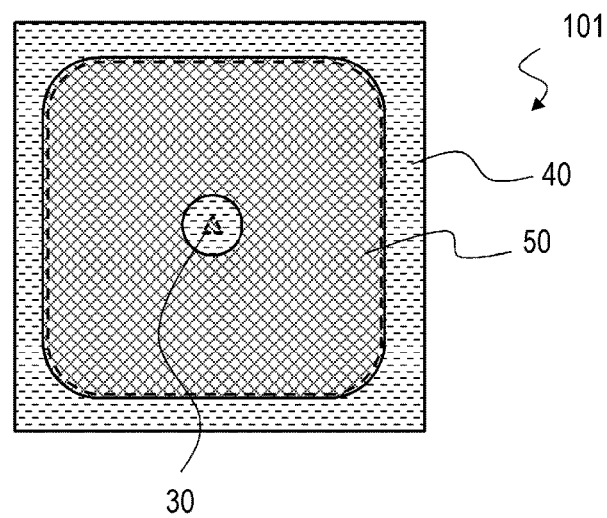
FIG. 1A is a schematic plan view of a semiconductor device of a first exemplary embodiment.

DETAILED DESCRIPTION (Knowledge that Underlies the Present Disclosure)

Prior to describing exemplary embodiments of the present disclosure, knowledge that underlies the present disclosure will now be described. It is desirable that semiconductor chips extracted from semiconductor wafers by epitaxial growth should each have an area of several centimeters square to implement a high current of several hundred amperes in power devices. However, securing the yield for large-area power devices is not easy. Following, semiconductor wafer by epitaxial growth is denoted 'epi wafer'.

For example, in the case of a silicon carbide semiconductor gathering attention for use in power devices, a micropipe which is one type of screw dislocation is created in a crystal growth direction and penetrates through the crystal. The micropipe is a crystalline defect, and a leakage current can arise via the micropipe. When a micropipe is in a silicon carbide substrate, the micropipe can be transferred (propagated) to an epitaxial semiconductor layer stacked on the silicon carbide substrate. Further, a leakage current can arise via a defect (epitaxial defect) newly generated in the epitaxial semiconductor layer. Examples of the epitaxial defect include a downfall defect which is a deposited matter on an epitaxial equipment taken in into the epitaxial semiconductor layer, and include an epitaxial defect such as an stacking defect (for example, a triangular defect and a carrot defect) caused by epitaxial growth conditions.

For example, density of micropipes in a silicon carbide semiconductor substrate and density of epitaxial defects in an epitaxial semiconductor layer add up to about several pieces/cm$^2$. Many of the power devices using a silicon carbide semiconductor employ a vertical structure. Therefore, if a power device contains a micropipe, the micropipe can be a path through which a leakage current flows when a reverse bias is applied to the device. Therefore, even if such a power device has only one micropipe or epitaxial defect in the device, an amount of a leakage current when a reverse bias is applied can be greater than the product specification, thereby making the device defective.

For example, if an SiC substrate having defect density of one piece/cm$^2$ is used to manufacture a device in one centimeter square, the yield on the device is estimated at around 50% in the Seeds model. According to the Seeds model, estimated yield Y is given by: $Y=1/(1+AD)$, where A is the chip area and D is the defect density.

PTL 1 discloses that in the case of a Schottky barrier diode of a silicon carbide semiconductor, a surface part of a micropipe is covered by an insulation layer to reduce an influence of the micropipe. However, according to PTL 1, an electrode is formed also on the insulation layer. According to a detailed study of the present inventor, a high voltage is applied by this electrode also to a region including the micropipe, and the micropipe functions as a path of a leakage, thereby causing a breakdown.

In view of this issue, the present inventor has conceived a novel semiconductor device and a method for manufacturing the semiconductor device. The following is a general description of a semiconductor device and a method for manufacturing the semiconductor device of the present disclosure.

[Item 1]

A semiconductor device includes a semiconductor substrate, a drift layer, a first electrode, and a second electrode. The drift layer is on a surface of the semiconductor substrate. The first electrode is in a region, on a surface of the drift layer, except a depletion control region and has an ohmic contact or a Schottky contact with the drift layer. The second electrode has an ohmic contact with a rear surface of the semiconductor substrate. The drift layer has a thickness of t, and the depletion control region includes a circular or sector-shaped region having a radius not less than t.

[Item 2]

Regarding the semiconductor device of Item 1, at least one of the drift layer in the depletion control region and the semiconductor substrate has a crystalline defect or a process-related defect in a plan view parallel to the surface of the drift layer. Further, in the plan view, a distance from the crystalline defect or the process-related defect to an outer edge of the depletion control region is not less than t.

[Item 3]

Regarding the semiconductor device of Item 1, the crystalline defect is a micropipe or an epitaxial defect.

[Item 4]

Regarding the semiconductor device of Items 1 to 3, the first electrode makes the Schottky contact with the drift layer, and the semiconductor device is a Schottky barrier diode.

[Item 5]

Regarding the semiconductor device of Items 1 to 3, the drift layer has a plurality of well regions in a surface part including a first principal surface. The well regions each include a source region. The semiconductor device further includes a gate insulation layer, a gate electrode, and an insulation layer.

The gate insulation layer is on the first principal layer of the drift layer, and exposes at least part of each of the source regions in the plurality of well regions. Outside the depletion control region, the gate electrode is formed on the gate insulation layer; and inside the depletion control region, the gate electrode is not formed on the gate insulation layer. Outside the depletion control region, the insulation layer covers the gate electrode; and inside the depletion control region, the insulation layer covers at least part of the gate insulation layer. Further, outside the depletion control region, the first electrode covers the insulation layer.

[Item 6]

A method for manufacturing a semiconductor device includes step (a), step (b), and step (c). In step (a), a semiconductor substrate having a drift layer is prepared. In step (b), at least one of a crystalline defect and a process-related defect in the drift layer and the semiconductor substrate is inspected. Then, coordinates of the crystalline defect or the process-related defect are obtained. Depending on the coordinates, a depletion control region is determined. In step (c), in a region, on a surface of the drift layer, except the depletion control region, a first electrode is formed to have an ohmic contact or a Schottky contact with the drift layer. Here, the drift layer has a thickness of t, and the depletion control region includes a circular or sector-shaped region having a radius not less than t.

[Item 7]

Regarding the method for manufacturing the semiconductor device of Item 6, in a plan view, a distance from a coordinate position of the crystalline defect or the process-related defect to an outer edge of the depletion control region is not less than t.

[Item 8]

Regarding the method for manufacturing the semiconductor device of Item 7, the crystalline defect is a micropipe or an epitaxial defect.

[Item 9]

Regarding the methods for manufacturing the semiconductor device of Items 7 to 9, the first electrode makes the Schottky contact with the drift layer, and the semiconductor device is a Schottky barrier diode.

[Item 10]

In step (a), the drift layer has a plurality of well regions in a surface part including a first principal surface, the well regions each including a source region. Further, between step (b) and step (c), there are a step of forming a gate insulation layer, a step of forming a gate electrode, and a step of forming an insulation layer. In the step of forming the gate insulation layer, the gate insulation layer is formed on the surface of the drift layer so as to expose at least part of each of the source regions in the plurality of well regions. In the step of forming the gate electrode, the gate electrode is formed such that, outside the depletion control region, the gate electrode is on the gate insulation layer and such that, inside the depletion control region, the gate electrode is not on the gate insulation layer. In the step of forming the insulation layer, outside the depletion control region, the insulation layer covers the gate electrode; and inside the depletion control region, the insulation layer covers at least part of the gate insulation layer. In step (c), the first electrode is formed such that, inside the depletion control region, the first electrode does not cover the insulation layer; and outside the depletion control region, the first electrode covers the insulation layer.

Hereinafter, more specific exemplary embodiments of the present disclosure will be described.

First Exemplary Embodiment

Figure 1B:
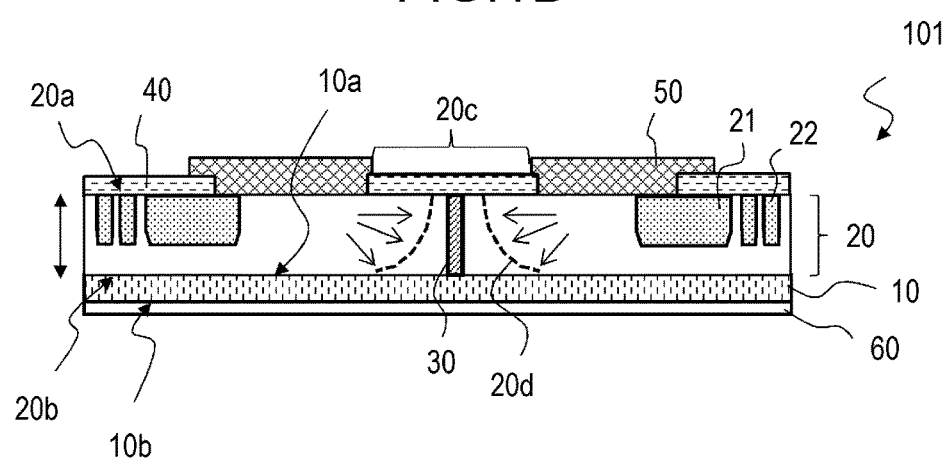
FIG. 1B is a schematic cross-sectional view of the semiconductor device of the first exemplary embodiment.

FIG. 1A is a plan view of semiconductor device 101 of the present exemplary embodiment, and FIG. 1B is a cross-sectional view of semiconductor device 101. In the present exemplary embodiment, semiconductor device 101 is a Schottky barrier diode. Semiconductor device 101 includes semiconductor substrate 10, drift layer 20, first electrode 50, and second electrode 60.

Semiconductor substrate 10 is of a first conductivity type and is formed of a silicon carbide semiconductor, gallium nitride semiconductor, or the like. For example, semiconductor substrate 10 is an n-type silicon carbide semiconductor substrate.

Drift layer 20 is an epitaxial semiconductor layer of the first conductivity type which is formed on upper surface 10a of semiconductor substrate 10 by epitaxial growth. Drift layer 20 is formed of, for example, an n-type silicon carbide semiconductor. Drift layer 20 has a thickness of t. For example, the thickness t is between about 5 μm and about 100 μm (inclusive). In FIG. 1B, drift layer 20 is shown to be thicker than semiconductor substrate 10 for easy understanding; however, in an actual semiconductor device, the thickness of drift layer 20 may be thicker than or thinner than the thickness of semiconductor substrate 10. Further, semiconductor device 101 may have a buffer layer between drift layer 20 and semiconductor substrate 10.

Figure 1C:
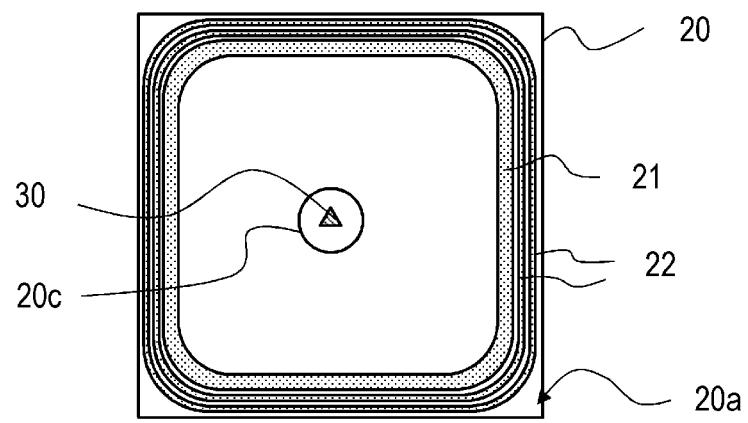
FIG. 1C is a schematic plan view of a drift layer of the semiconductor device of the first exemplary embodiment.

FIG. 1C is a plan view of drift layer 20. On upper surface 20a of drift layer 20, there are provided annular guard ring 21 and a plurality of field limiting rings (FLRs) 22 surrounding guard ring 21. Guard ring 21 and FLRs 22 are provided inside drift layer 20 from upper surface 20a to have predetermined depths. That is, guard ring 21 and FLRs 22 are provided in a surface part of the drift layer. Guard ring 21 and FLRs 22 are of a second conductivity type.

Semiconductor device 101 has defect 30 in at least one of semiconductor substrate 10 and drift layer 20. Defect 30 is a crystalline defect or a process-related defect, and there is at least one defect 30. FIG. 1B shows an example in which semiconductor device 101 has in drift layer 20 a micropipe, which is one type of screw dislocation, as defect 30. Examples of the crystalline defect include a downfall defect, a triangular defect, a carrot defect, and a stripe defect which are on the surfaces of semiconductor substrate 10 and drift layer 20. Further, examples of a defect inside semiconductor substrate 10 and drift layer 20 include a stacking fault, a basal plane dislocation, and a screw dislocation. The micropipe is one type of the screw dislocation. Examples of a process-related defect include: a conductive or non-conductive foreign substance which is on upper surface 10a of semiconductor substrate 10 and upper surface 20a of drift layer 20; an unintended implantation region formed inside drift layer 20 due to an abnormality of a mask used when above-described guard ring 21 and FLRs 22 are formed; and an abnormality due to a thermal treatment of upper surface 20a of drift layer 20.

Defect 30 on upper surface 10a of semiconductor substrate 10 and upper surface 20a of drift layer 20 can be observed, for example, with an optical microscope. Further, the defect inside semiconductor substrate 10 and drift layer 20 can be observed by a photoluminescence method or the like. There is commercially available a defect inspection apparatus in which optical observation or a photoluminescence method is used, and by using the defect inspection apparatus, it is possible to identify and record position coordinates of the defect on the semiconductor wafer. Further, in some cases, it is possible to detect as the abnormality of electric characteristics the unintended implantation region, the abnormality due to a thermal treatment on upper surface 20a of drift layer 20, and other defects. In this case, it is possible to detect these abnormalities, for example, by using a defect inspection apparatus which measures electric characteristics.

Figure 1D:
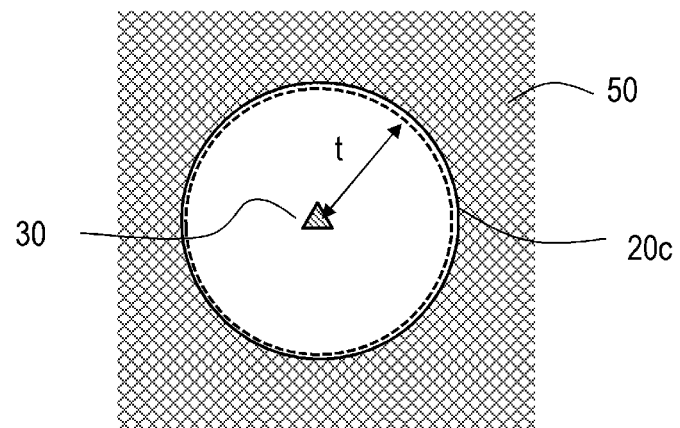
FIG. 1D is a partially enlarged schematic plan view showing a first electrode of the semiconductor device of the first exemplary embodiment.
Figure 1E:
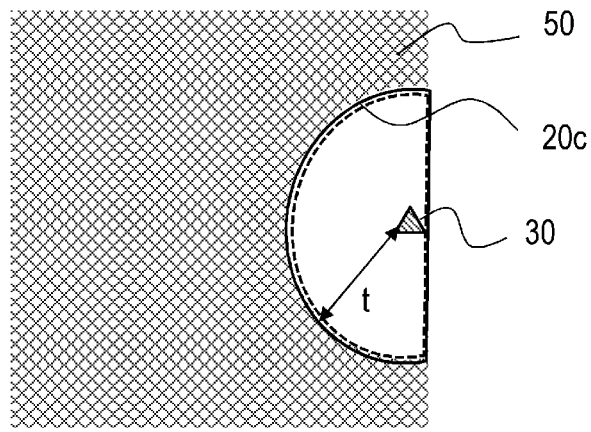
FIG. 1E is another partially enlarged schematic plan view of the first electrode of the semiconductor device of the first exemplary embodiment.
Figure 1F:
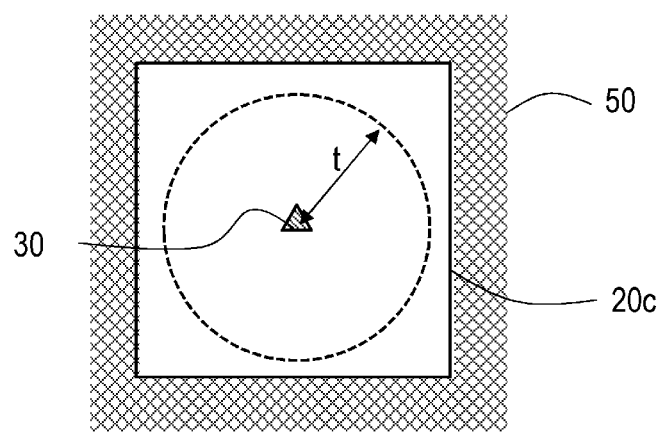
FIG. 1F is another partially enlarged schematic plan view of the first electrode of the semiconductor device of the first exemplary embodiment.

First electrode 50 is in a region, on upper surface 20a of drift layer 20, except at least depletion control region 20c. An outer edge of first electrode 50 is on guard ring 21. FIG. 1D to FIG. 1F are partially enlarged plan views of first electrode 50. In the plan view parallel to upper surface 20a of drift layer 20 of semiconductor device 101, defect 30 is in depletion control region 20c represented by a solid line. Depletion control region 20c has a shape containing a circle or a sector having a radius of not less than t. In other words, depletion control region 20c includes whole of a circular or sector-shaped region having a radius not less than t. FIG. 1D shows an example of depletion control region 20c including a circular region represented by a broken line, and FIG. 1E shows an example of depletion control region 20c including a sector-shaped region represented by a broke line. When defect 30 in an end part of a region surrounded by guard ring 21 on upper surface 20a of drift layer 20, depletion control region 20c may include a semicircular region, for example. Depletion control region 20c has only to include a circular or sector-shaped region satisfying the above-described conditions, and depletion control region 20c is not limited to a circle or a sector. For example, as shown in FIG. 1F, depletion control region 20c may have a rectangular shape, and may have a shape such as a triangular shape, a hexagonal shape, and the like. Further, if there are two or more defects 30, there may be independently provided depletion control regions 20c each corresponding to each of the defects, depending on the positions of defects 30; or alternatively, of a plurality of depletion control regions 20c, depletion control regions 20c for closely-lying two or more defects 30 may be provided as one body.

In a plan view, a distance from defect 30 in depletion control region 20c to the outer edge of depletion control region 20c is not less than t. First electrode 50 is not provided on depletion control region 20c of upper surface 20a of drift layer 20. Therefore, first electrode 50 has an opening or a hole corresponding to depletion control region 20c. A distance between an inner edge of first electrode 50 defining this opening or hole and defect 30 is not less than t.

First electrode 50 having the opening corresponding to depletion control region 20c can be formed by forming a resist pattern in a region including depletion control region 20c or by forming in a resist layer the opening corresponding to depletion control region 20c. The above-described resist pattern can be formed by using the position coordinates of the defect determined by the above-described defect inspection apparatus, by dropping uncured resist material on the position, and curing the resist material; or alternatively, the resist pattern can be formed by applying a laser beam to the resist layer to remove part of the resist layer. A detailed description will be given below.

First electrode 50 has an ohmic contact or a Schottky contact with drift layer 20. In the present exemplary embodiment, since semiconductor device 101 is a Schottky barrier diode, first electrode 50 makes the Schottky contact with drift layer 20. First electrode 50 is formed of an electrode material which can make the ohmic contact or the Schottky contact with drift layer 20. In the present exemplary embodiment, first electrode 50 is formed of metal such as nickel, titanium, or aluminum. First electrode 50 may be a single layer or stacked layers.

In the present exemplary embodiment, on upper surface 20a of drift layer 20, insulation layer 40 covers an outer side of guard ring 21, and an inner edge of the insulation layer is on guard ring 21. On upper surface 20a of drift layer 20, insulation layer 40 preferably covers depletion control region 20c.

Second electrode 60 is on lower surface 10b of semiconductor substrate 10 and has an ohmic contact with semiconductor substrate 10. Second electrode 60 may be a single layer or stacked layers. Although FIG. 1B and other drawings do not show, semiconductor device 101 may further include a protective film covering part of the whole structure.

In semiconductor device 101, when a voltage is applied between first electrode 50 and second electrode 60 such that the Schottky contact between first electrode 50 and drift layer 20 is reversely biased, depletion layer 20d is formed on an interface between first electrode 50 and drift layer 20. As the applied voltage is increased, depletion layer 20d extends and reaches an interface between semiconductor substrate 10 and drift layer 20. That is, a thickness of depletion layer 20d becomes equal to the thickness t of drift layer 20. At this time, depletion layer 20d extends also in a direction parallel to upper surface 20a, which is a direction perpendicular to a thickness direction of drift layer 20. When the applied voltage is higher than the voltage with which depletion layer 20d reaches the interface between semiconductor substrate 10 and drift layer 20, depletion layer 20d extends more largely in the parallel direction than in the thickness direction. However, a maximum apply voltage is usually specified by a device specification; thus, depletion layer 20d does not extremely extend in the parallel direction. The radius of depletion control region 20c is preferably not less than t and is more preferably not less than 2 t.

With this arrangement, even if a reverse bias voltage is applied between first electrode 50 and second electrode 60, the region, of drift layer 20, having the defect 30 is not depleted; thus, a high reverse bias voltage is not applied to defect 30, thereby preventing or reducing generation of a leakage current.

Figure 2:
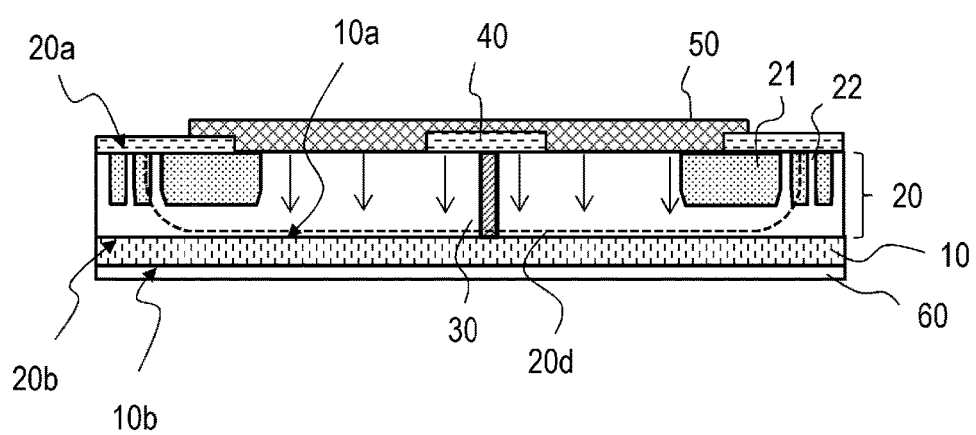
FIG. 2 is a diagram illustrating how a depletion layer extends in a conventional semiconductor device.

FIG. 2 shows the semiconductor device disclosed in PTL 1 at a state where a reverse bias voltage is applied. Insulation layer 40 is provided on upper surface 20a of drift layer 20 to cover defect 30 as shown in FIG. 2; however, first electrode 50 is on defect 30. Therefore, the reverse bias voltage is applied also to a part of drift layer 20, on which defect 30 lies, via insulation layer 40, and the depletion layer extends also to the part on which defect 30 lies. Further, the depletion layer also extends toward defect 30 in the horizontal direction from an end part of insulation layer 40 on defect 30. As a result, in the semiconductor device shown in FIG. 2, defect 30 lies in depletion layer 20d. Defect 30 in depletion layer 20d to which a high electric field is applied functions as a path of a leakage current; thus, in the semiconductor device shown in FIG. 2, when a reverse bias voltage is applied between first electrode 50 and second electrode 60, a leakage current can be easily generated via defect 30.

As described above, a semiconductor device of the present exemplary embodiment includes a first electrode which has an ohmic contact or a Schottky contact with a drift layer in a region, on a surface of the drift layer, except a depletion control region, and the depletion control region has a shape including a circle or a sector having a radius of not less than t. With this arrangement, it is possible to set a distance from the defect to an outer edge of the depletion control region to a distance not less than t, and it is thus possible to prevent or reduce extension of the depletion layer to the defect when a reverse bias is applied. Therefore, it is possible to prevent or reduce generation of a leakage current via the defect. That is, even if the semiconductor substrate and the drift layer have a defect, it is possible to manufacture a semiconductor device which has a small leakage current and can thus satisfy the specification of the product, whereby the product yield can be improved.

Figure 3A:
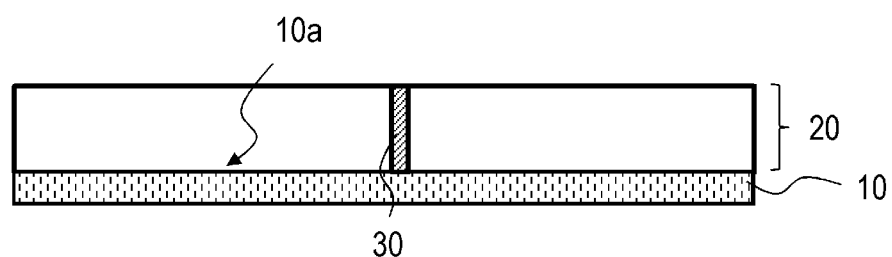
FIG. 3A is a process cross-sectional view illustrating a method for manufacturing the semiconductor device of the first exemplary embodiment.
Figure 3B:
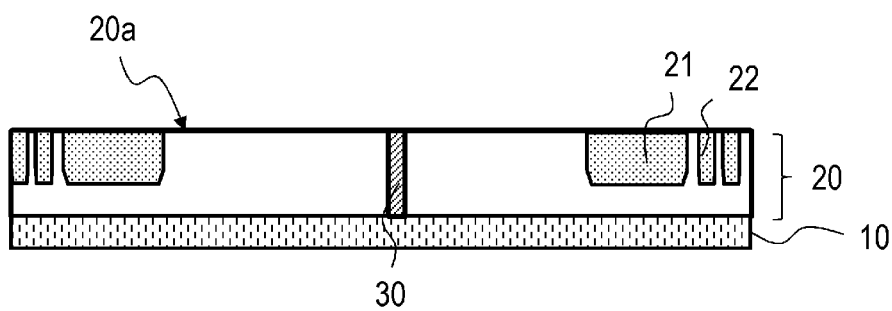
FIG. 3B is a process cross-sectional view illustrating the method for manufacturing the semiconductor device of the first exemplary embodiment.
Figure 3C:
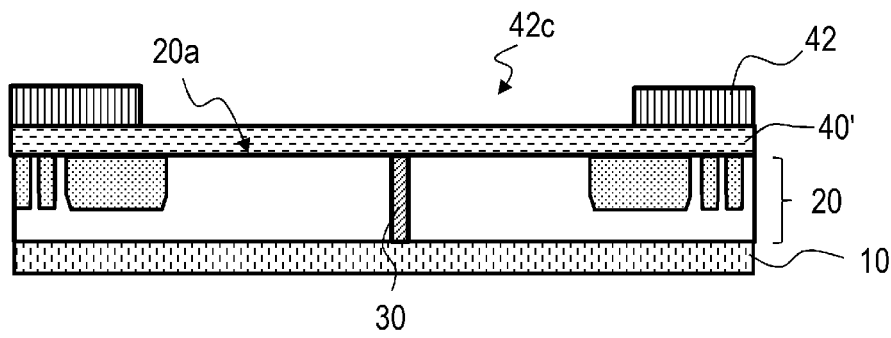
FIG. 3C is a process cross-sectional view illustrating the method for manufacturing the semiconductor device of the first exemplary embodiment.
Figure 3D:
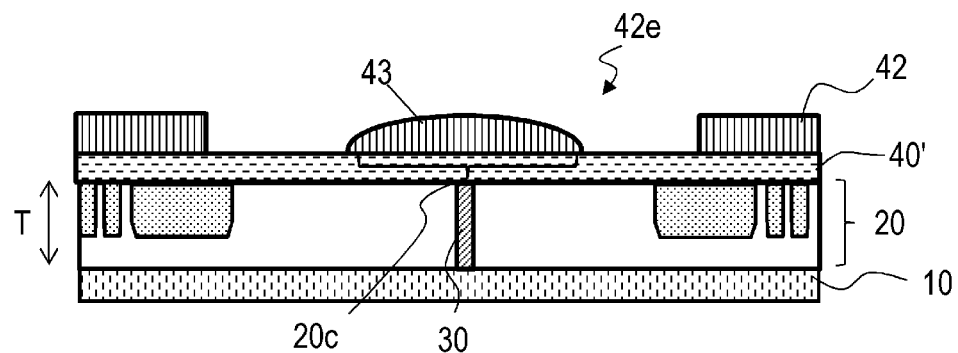
FIG. 3D is a process cross-sectional view illustrating the method for manufacturing the semiconductor device of the first exemplary embodiment.
Figure 3E:
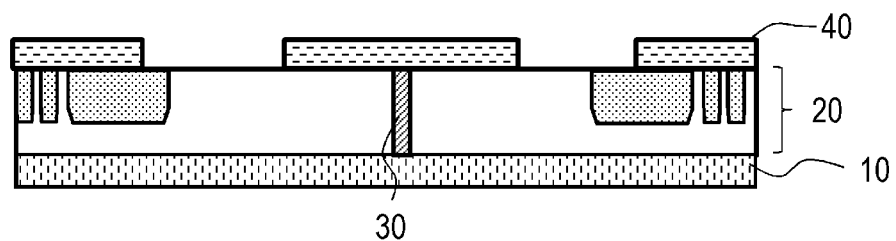
FIG. 3E is a process cross-sectional view illustrating the method for manufacturing the semiconductor device of the first exemplary embodiment.
Figure 3F:
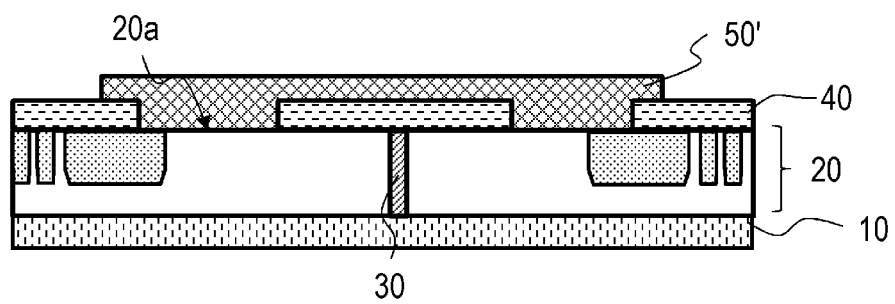
FIG. 3F is a process cross-sectional view illustrating the method for manufacturing the semiconductor device of the first exemplary embodiment.
Figure 3G:
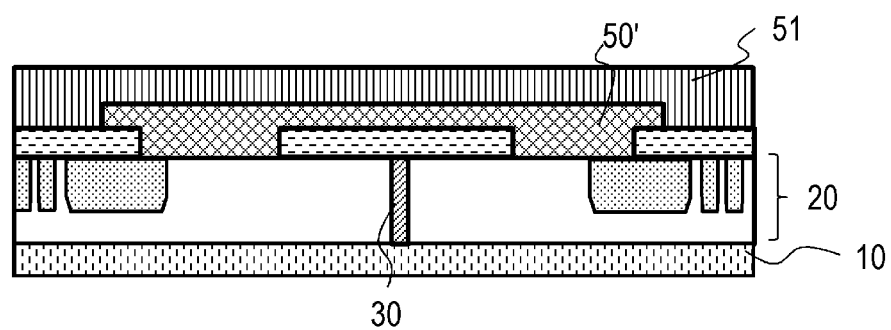
FIG. 3G is a process cross-sectional view illustrating the method for manufacturing the semiconductor device of the first exemplary embodiment.
Figure 3H:
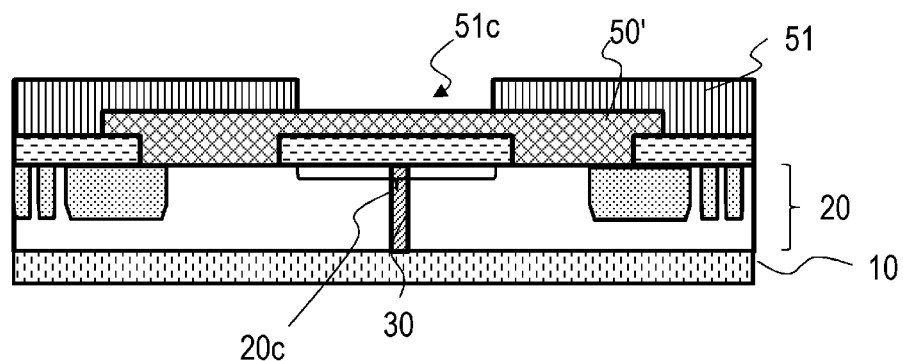
FIG. 3H is a process cross-sectional view illustrating the method for manufacturing the semiconductor device of the first exemplary embodiment.
Figure 3I:
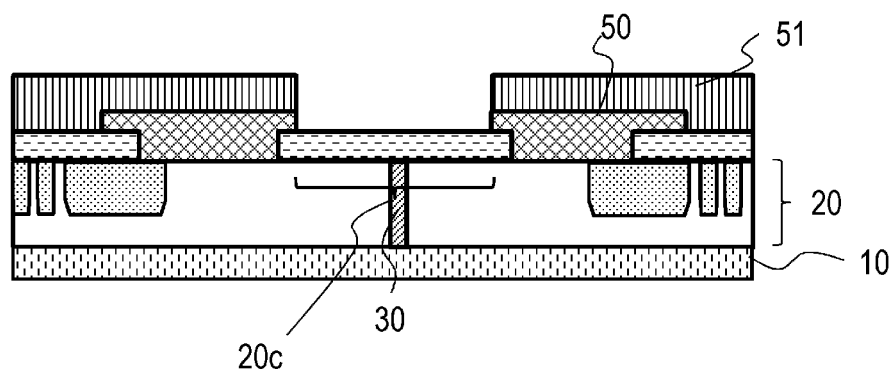
FIG. 3I is a process cross-sectional view illustrating the method for manufacturing the semiconductor device of the first exemplary embodiment.
Figure 3J:
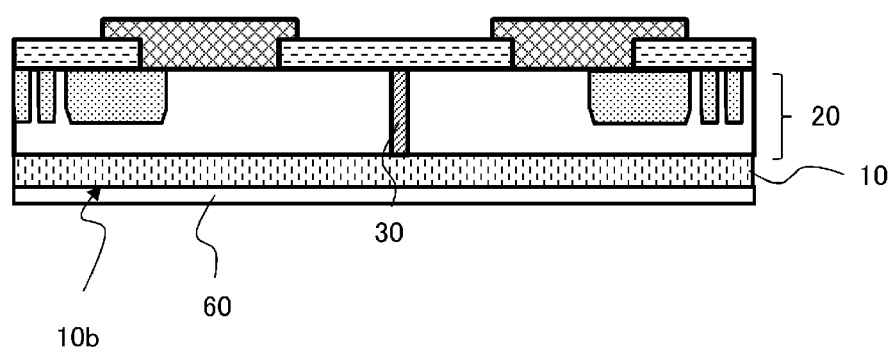
FIG. 3J is a process cross-sectional view illustrating the method for manufacturing the semiconductor device of the first exemplary embodiment.
Figure 4:
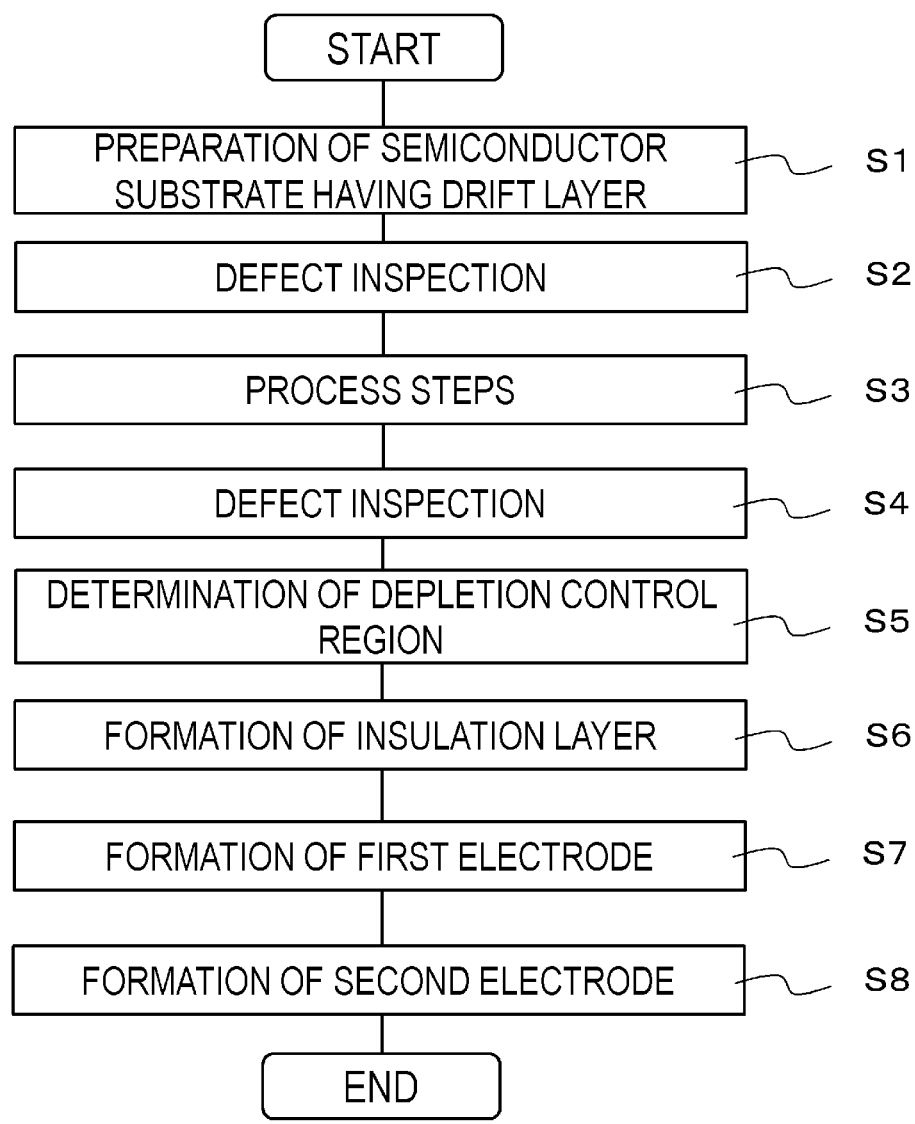
FIG. 4 is a flowchart illustrating a method for manufacturing the semiconductor devices of the first exemplary embodiment and a second exemplary embodiment.

With reference to FIG. 3A to FIG. 3J and FIG. 4, a method for manufacturing semiconductor device 101 will be described. FIG. 3A to FIG. 3J are process cross-sectional views illustrating the method for manufacturing semiconductor device 101, and FIG. 4 is a flowchart.

As shown in FIG. 3A, semiconductor substrate 10 on which drift layer 20 is formed is prepared (step S1). For example, drift layer 20 made of an n-type silicon carbide is epitaxial-grown on semiconductor substrate 10 made of an n-type silicon carbide semiconductor. As shown in FIG. 3A, drift layer 20 has defect 30.

Next, the defect in semiconductor substrate 10 on which drift layer 20 is formed is detected by using a defect inspection apparatus, and position coordinates of the detected defect is recorded (step S2). As described above, to detect a crystalline defect in drift layer 20, it is possible to use a defect inspection apparatus using a photoluminescence method. Further, to detect defect 30 on upper surface 20a of drift layer 20, it is possible to use a defect inspection apparatus using optical image recognition, for example. Also before drift layer 20 is formed, defects may be detected by using the defect inspection apparatus.

A mask pattern for guard ring 21 and FLRs 22 is formed on the surface of drift layer 20, and p-type impurities are implanted. After that, drift layer 20 is subjected to a thermal treatment to activate the impurities to form patterns of guard ring 21 and FLRs 22 on drift layer 20 as shown in FIG. 3B (step S3). After the patterns of guard ring 21 and FLRs 22 are formed, an inspection for defect 30 may be performed again using the defect inspection apparatus to inspect presence or absence of an abnormally implanted region, an abnormality of the surface of drift layer 20, and the like (step S4).

On the basis of the defect 30 and the position coordinates of the defect 30 recorded through the above-described steps, depletion control region 20c is determined (step S5). For example, if the thickness of the drift layer 20 is t, depletion control region 20c is determined to be an inside of a circle which is centered at the position coordinates of defect 30 and has a radius of t.

Insulation layer 40 is formed on upper surface 20a of drift layer 20 (step S6). Specifically, as shown in FIG. 3C, insulation layer 40' is first formed on upper surface 20a of drift layer 20 by using an insulation material such as silicon oxide or silicon nitride. After that, mask layer 42 is formed to have an opening pattern 42c whose outer edge is on guard ring 21. Further, as shown in FIG. 3D, resist pattern 43 covering depletion control region 20c is formed on insulation layer 40' in opening pattern 42c. Resist pattern 43 can be formed, for example, by dropping resist at the recorded position coordinates of the defect. By adjusting viscosity and an amount of the resist, resist pattern 43 can be formed to have a circular shape whose center coincides in a plan view with the position coordinates of defect 30 and has a radius of not less than t. As long as an outer edge of resist pattern 43 is not less than t distant from the position coordinates of defect 30, the center of resist pattern 43 does not have to coincide with the position coordinates of defect 30. In addition, the value of the radius may be greater than t, and opening pattern 42c may have a shape other than a circle. Here, taking overlapping of insulation layer 40 and first electrode 50 into consideration, mask layer 42 is formed to have a circular shape with a radius of 1.1 t, for example.

Mask layer 42 and resist pattern 43 are used to etch insulation layer 40' by a dry etching process or a wet etching process, so that insulation layer 40 is formed as shown in FIG. 3E.

Next, first electrode 50 will be formed (step S7). First, as shown in FIG. 3F, a film of an electrode material is formed on drift layer 20 to cover the above-described structure and is then patterned to form first electrode 50' which covers an exposed part of upper surface 20a of drift layer 20. Further, as shown in FIG. 3G, resist layer 51 is formed on first electrode 50', and opening 51c is formed in resist layer 51 to coincide with depletion control region 20c as shown in FIG. 3H. Opening 51c can be formed by removing part of resist layer 51 by, for example, laser machining. By removing first electrode 50' in opening 51c of resist layer 51, first electrode 50 is formed as shown in FIG. 3I.

After that, as shown in FIG. 3J, resist layer 51 is removed, and second electrode 60 is then formed on lower surface 10b of semiconductor substrate 10 (step S8). With these steps, semiconductor device 101 is completed.

Second Exemplary Embodiment

Figure 5A:
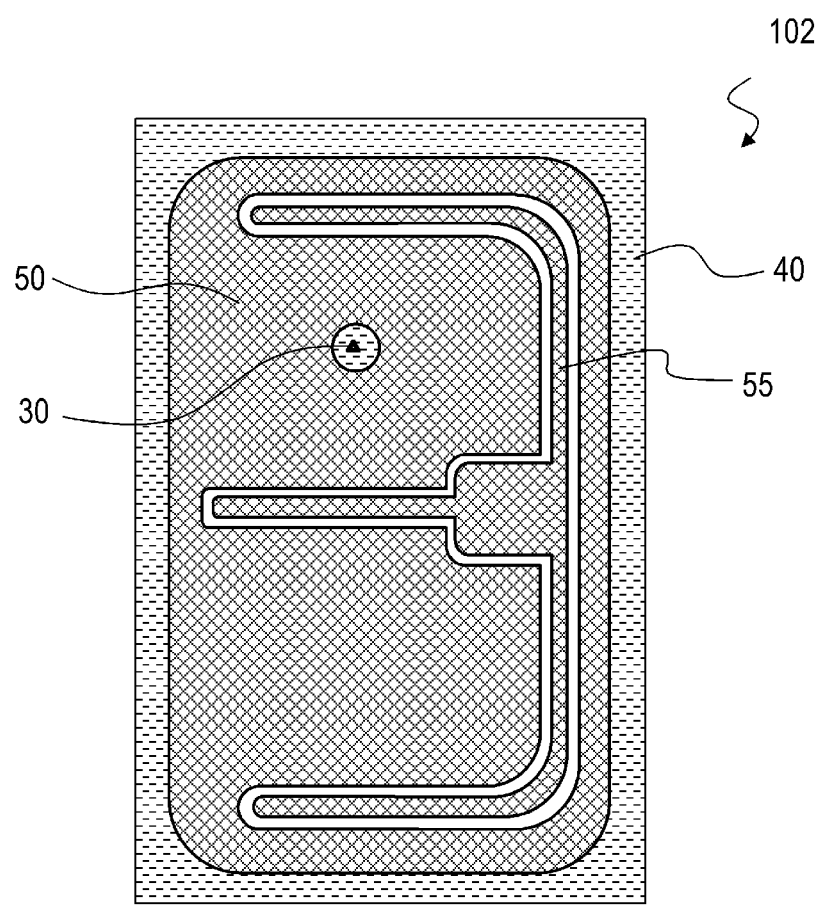
FIG. 5A is a schematic plan view of the semiconductor device of the second exemplary embodiment.
Figure 5B:
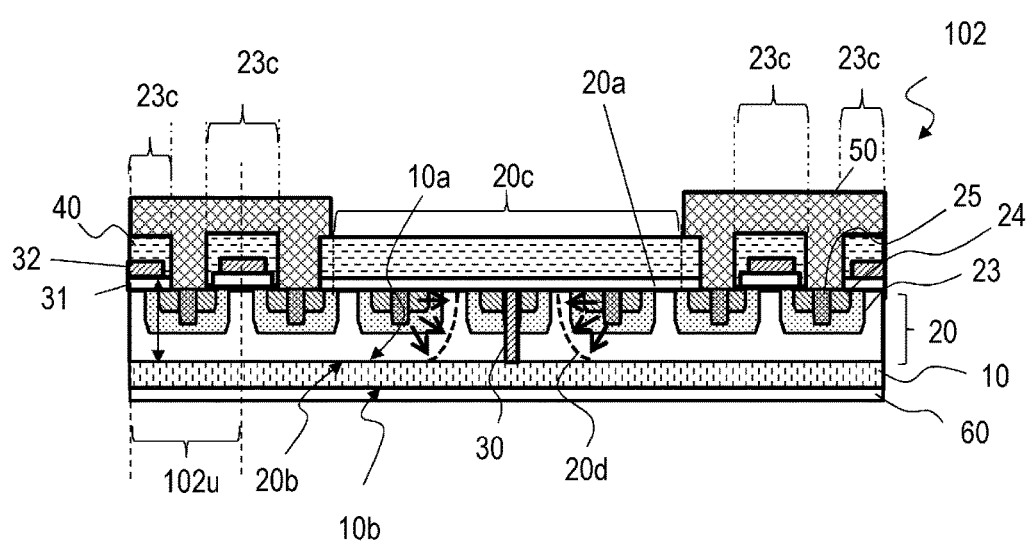
FIG. 5B is a schematic cross-sectional view of the semiconductor device of the second exemplary embodiment.

FIG. 5A is a plan view of semiconductor device 102 of the present exemplary embodiment, and FIG. 5B is an enlarged cross-sectional view in the vicinity of depletion control region 20c of semiconductor device 102. In the present exemplary embodiment, semiconductor device 102 is a power metal oxide semiconductor field effect transistor (MOSFET). Semiconductor device 102 includes semiconductor substrate 10, drift layer 20, first electrode 50, and second electrode 60. Semiconductor device 102 is different from semiconductor device 101 of the first exemplary embodiment in a function as a semiconductor device but is similar in the configuration for preventing or reducing the leakage current due to defect 30 in semiconductor substrate 10 and drift layer 20. Therefore, the structure similar to the structure in the first exemplary embodiment is not described again in some cases.

Semiconductor device 102 includes a plurality of unit cells 102u. Since each unit cell 102u has one field effect transistor (FET), semiconductor device 102 including the plurality of unit cells 102u includes a plurality of parallel-connected FETs.

Similarly to the first exemplary embodiment, semiconductor substrate 10 is of a first conductivity type and is formed of a silicon carbide semiconductor, gallium nitride semiconductor, or the like. For example, semiconductor substrate 10 is an n-type silicon carbide semiconductor substrate.

Further, drift layer 20 is an epitaxial semiconductor layer of the first conductivity type which is formed on upper surface 10a of semiconductor substrate 10 by epitaxial growth. Drift layer 20 is formed of, for example, an n-type silicon carbide semiconductor. Drift layer 20 has a thickness of t. Semiconductor device 102 may have a buffer layer between drift layer 20 and semiconductor substrate 10.

Drift layer 20 has a plurality of well regions 23, of a second conductivity type, on a surface part including upper surface 20a. Each well region 23 includes source region 24 of the first conductivity type and contact region 25 of the second conductivity type which is provided in source region 24 and is connected, below source region 24, to well region 23.

Semiconductor device 102 includes: gate insulation layer 31 which is on upper surface 20a of drift layer 20 and exposes at least part of source region 24 of each well region 23, and gate electrodes 32 which are formed on gate insulation layer 31 outside depletion control region 23c but are not formed on gate insulation layer 31 inside depletion control region 23c. Semiconductor device 102 may further include a channel layer made of silicon carbide of the first conductivity type between drift layer 20 and gate insulation layer 31. Semiconductor device 102 further includes insulation layer 40 covering gate electrodes 32 and covering a structure on upper surface 20a of drift layer 20. Insulation layer 40 functions as an interlayer insulation layer.

Similarly to the first exemplary embodiment, first electrode 50 is in a region, on upper surface 20a of drift layer 20, except depletion control region 20c. Outside depletion control region 20c, first electrode 50 has ohmic contacts with source regions 24 and contact regions 25 at parts, of respective source regions 24, exposed from gate insulation layer 31. Further, outside depletion control region 20c, first electrode 50 covers insulation layer 40. In semiconductor device 102, first electrode 50 functions as a source wire.

Similarly to the first exemplary embodiment, semiconductor device 102 has defect 30 in at least one of semiconductor substrate 10 and drift layer 20. As described with reference to FIG. 1D to FIG. 1F, in the plan view parallel to upper surface 20a of drift layer 20 of semiconductor device 102, defect 30 is in depletion control region 20c. Depletion control region 20c has a shape including a circle or a sector having a radius of not less than t. Further, in a plan view, a distance from defect 30 in depletion control region 20c to an outer edge of depletion control region 20c is not less than t.

Second electrode 60 is on lower surface 10b of semiconductor substrate 10 and has an ohmic contact with semiconductor substrate 10. Second electrode 60 may be a single layer or stacked layers. Second electrode 60 is a drain electrode in the present exemplary embodiment. Although FIG. 5B and other drawings do not show, semiconductor device 102 may further include a protective film covering part of the whole structure. Further, gate electrodes 32 are connected to gate wire 55 shown in FIG. 5A at positions not shown in FIG. 5B.

In semiconductor device 102, interfaces of well regions 23 and a part of drift layer 20, except well regions 23 make p-n junctions. Therefore, when a voltage is applied between first electrode 50 and second electrode 60 so as to reversely bias the p-n junctions, depletion layers are formed in well regions 23 and in a part of drift layer 20, except well regions 23. As the applied voltage is increased, depletion layer 20d extends and reaches upper surface 20a of drift layer 20 and an interface between semiconductor substrate 10 and drift layer 20. That is, depletion layer 20d has a thickness oft in a thickness direction of drift layer 20. At this time, depletion layer 20d extends also in a direction parallel to upper surface 20a, which is a direction perpendicular to the thickness direction of drift layer 20. When the applied voltage is higher than the voltage with which depletion layer 20d reaches the interface between semiconductor substrate 10 and drift layer 20, depletion layer 20d extends more largely in the parallel direction than in the thickness direction. However, a maximum apply voltage is normally specified by a device specification; thus, depletion layer 20d does not extremely extend in the parallel direction. The radius of depletion control region 20c is preferably not less than t and is more preferably not less than 2 t.

With this arrangement, even if a reverse bias voltage is applied between first electrode 50 and second electrode 60, the region, of drift layer 20, having the defect 30 is not depleted; thus, a high reverse bias voltage is not applied to defect 30, thereby preventing or reducing generation of a leakage current. Thus, according to the semiconductor device of the present exemplary embodiment, similarly to the first exemplary embodiment, even if the semiconductor substrate and the drift layer have a defect, it is possible to manufacture a semiconductor device which has a small leakage current and can thus satisfy the specification of the product, whereby the product yield can be improved.

With reference to FIG. 3A, FIG. 6A to FIG. 6J and FIG. 4, a method for manufacturing semiconductor device 102 will be described. FIG. 6A to FIG. 6J are process cross-sectional views illustrating the method for manufacturing semiconductor device 102, and FIG. 4 is a flowchart.

First, similarly to the first exemplary embodiment, semiconductor substrate 10 on which drift layer 20 is formed is prepared (step S1). Further, the defect in semiconductor substrate 10 on which drift layer 20 is formed is detected by using a defect inspection apparatus, and position coordinates of detected defect 30 are recorded (step S2).

Figure 6A:
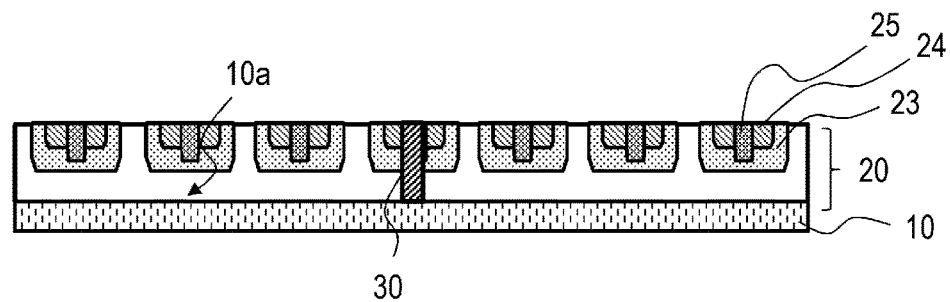
FIG. 6A is a process cross-sectional view illustrating a method for manufacturing the semiconductor device of the second exemplary embodiment.

As shown in FIG. 6A, by implanting impurities and then performing a thermal treatment, well regions 23, source regions 24, and contact regions 25 are formed in a surface part of drift layer 20. As described in the first exemplary embodiment, the defect inspection may be performed again after the thermal treatment (step S4).

On the basis of the defect 30 and the position coordinates of the defect 30 recorded through the above-described steps, depletion control region 20c is determined (step S5). For example, if the thickness of the drift layer 20 is t, depletion control region 20c is determined to be an inside of a circle which is centered at the position coordinates of defect 30 and has a radius of t.

Figure 6B:
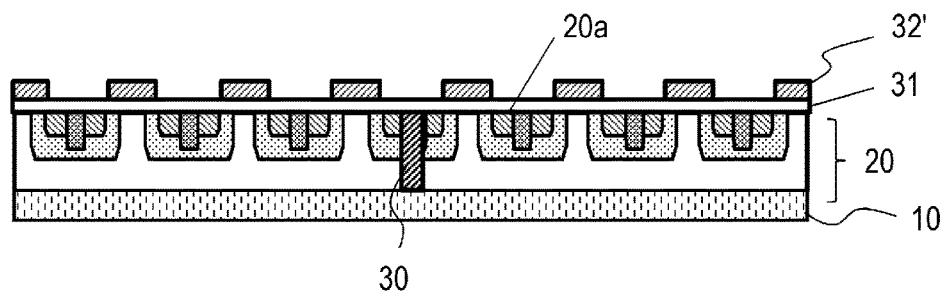
FIG. 6B is a process cross-sectional view illustrating the method for manufacturing the semiconductor device of the second exemplary embodiment.
Figure 6C:
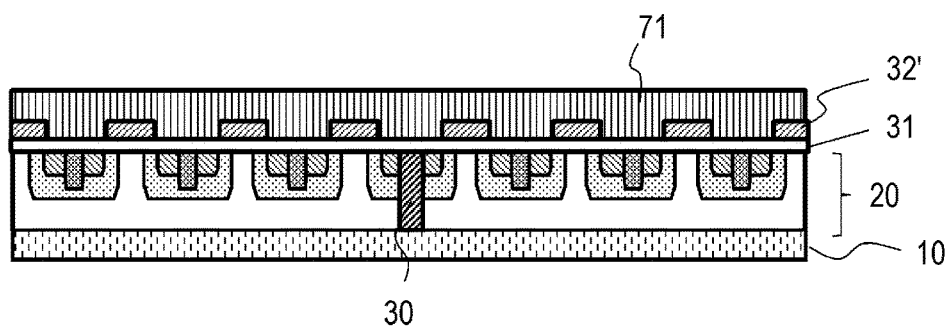
FIG. 6C is a process cross-sectional view illustrating the method for manufacturing the semiconductor device of the second exemplary embodiment.
Figure 6D:
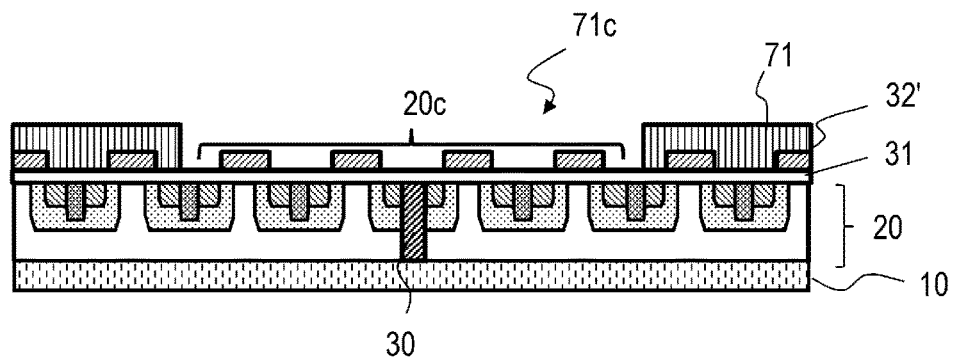
FIG. 6D is a process cross-sectional view illustrating the method for manufacturing the semiconductor device of the second exemplary embodiment.

As shown in FIG. 6B, gate insulation layer 31 is formed on upper surface 20a of drift layer 20, and gate electrodes 32' are formed on gate insulation layer 31. As shown in FIG. 6C, resist layer 71 is formed to cover gate electrodes 32' and gate insulation layer 31, and opening 71c is formed in resist layer 71 as shown in FIG. 6D. Opening 71c coincides with depletion control region 20c. Opening 71c can be formed by removing part of resist layer 71 by, for example, laser machining.

Figure 6E:
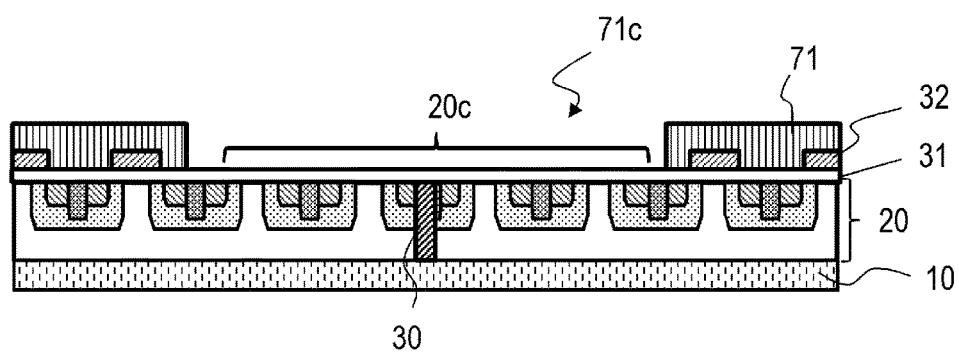
FIG. 6E is a process cross-sectional view illustrating the method for manufacturing the semiconductor device of the second exemplary embodiment.

As shown in FIG. 6E, gate electrodes 32' exposed in opening 71c are removed by a dry etching process or a wet etching process so as to form gate electrodes 32 such that gate electrodes 32 are not on gate insulation layer 31 inside depletion control region 20c.

Figure 6F:
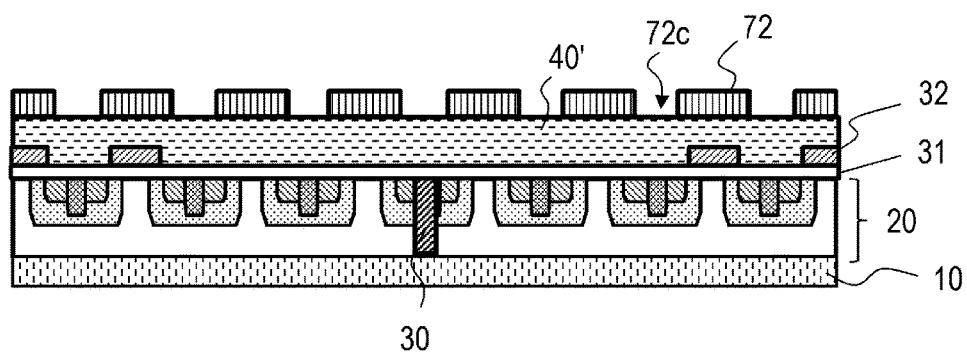
FIG. 6F is a process cross-sectional view illustrating the method for manufacturing the semiconductor device of the second exemplary embodiment.

As shown in FIG. 6F, after resist layer 71 is removed, insulation layer 40' is formed to cover gate electrodes 32 and gate insulation layer 31 (step S6). Subsequently, on insulation layer 40', there is formed resist layer 72 having openings 72c for defining contact holes.

Figure 6G:
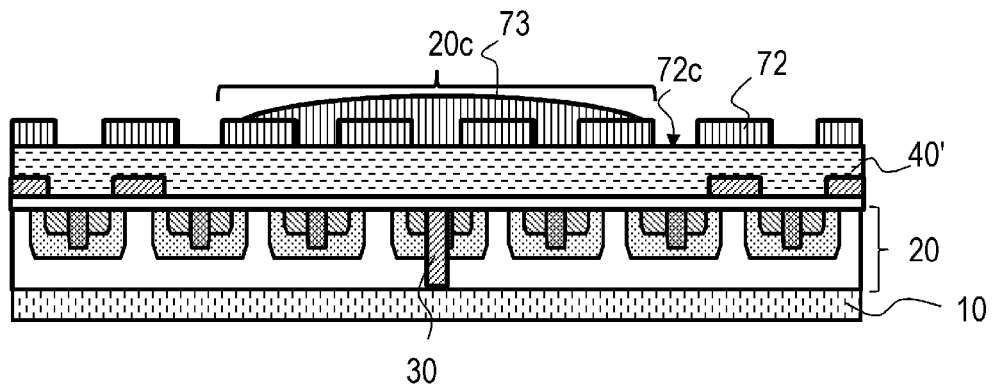
FIG. 6G is a process cross-sectional view illustrating the method for manufacturing the semiconductor device of the second exemplary embodiment.

As shown in FIG. 6G, resist pattern 73 is formed to cover depletion control region 20c. Resist pattern 73 can be formed, for example, by dropping resist at the recorded position coordinates of the defect. By adjusting viscosity and an amount of the resist, resist pattern 73 can be formed to have a circular shape whose center coincides in a plan view with the position coordinates of defect 30 and has a radius of not less than t. As long as an outer edge of resist pattern 73 is not less than t distant from the position coordinates of defect 30, the center of resist pattern 73 does not have to coincide with the position coordinates of defect 30. In addition, the value of the radius may be greater than t, and resist pattern 73 may have a shape other than a circle. Here, taking overlapping of insulation layer 40' and first electrode 50 into consideration, resist pattern 73 is formed to have a circular shape with a radius of 1.1 t, for example.

Figure 6H:
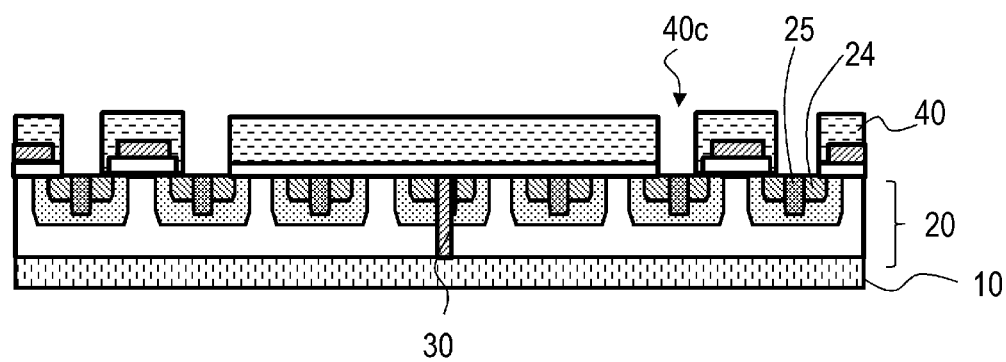
FIG. 6H is a process cross-sectional view illustrating the method for manufacturing the semiconductor device of the second exemplary embodiment.

Resist layer 72 and resist pattern 73 are used to etch insulation layer 40' by a dry etching process or a wet etching process, so that insulation layer 40 is formed to have contact holes 40c each of which part of each source region 24 and each contact region 25 are exposed, as shown in FIG. 6H. After that, resist layer 72 and resist pattern 73 are removed.

Figure 6I:
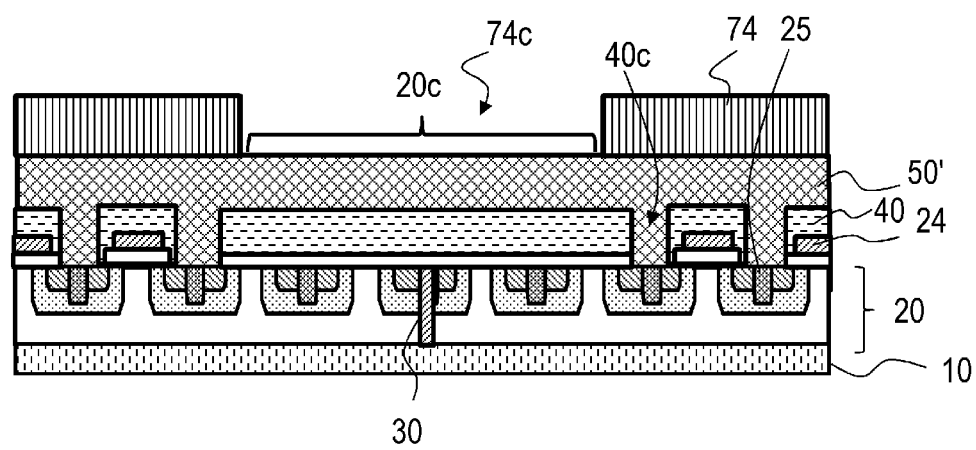
FIG. 6I is a process cross-sectional view illustrating the method for manufacturing the semiconductor device of the second exemplary embodiment.

Next, first electrode 50 will be formed (step S7). First, as shown in FIG. 6I, an electrode material is deposited on insulation layer 40 and in contact holes 40c so as to cover the above-described structure, and first electrode 50' is formed to be in contact with part of each source region 24 and each contact region 25. On first electrode 50', there is formed resist layer 74 having opening 74c which coincides with depletion control region 20c. Opening 74c can be formed by removing part of resist layer 74 by, for example, laser machining while the position coordinate of defect 30 is being used.

Resist layer 74 is used to remove first electrode 50' in opening 74c; thus, first electrode 50 is formed such that, inside depletion control region 20c, first electrode 50 does not cover insulation layer 40 and such that, outside depletion control region 20c, first electrode 50 covers insulation layer 40.

Figure 6J:
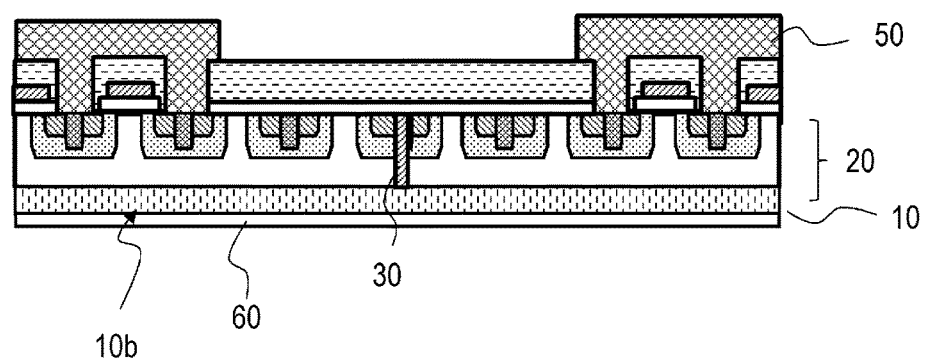
FIG. 6J is a process cross-sectional view illustrating the method for manufacturing the semiconductor device of the second exemplary embodiment.

After that, as shown in FIG. 6J, resist layer 74 is removed, and second electrode 60 is then formed on lower surface 10b of semiconductor substrate 10 (step S8). With these steps, semiconductor device 102 is completed.

A semiconductor device and a method for manufacturing the semiconductor device in the exemplary embodiments according to the present disclosure can be suitably used for semiconductor devices for various use, and, in particular, can be suitably used for a power device such as a semiconductor device having a large chip area.

What is claimed is:

1. A semiconductor device comprising:
   semiconductor substrate;
   a drift layer on a surface of the semiconductor substrate;
   a first electrode in a region, on a surface of the drift layer, except a depletion control region, the first electrode having an ohmic contact or a Schottky contact with the drift layer; and
   a second electrode having an ohmic contact with a rear surface of the semiconductor substrate,
   wherein
   the drift layer has a thickness of t, and
   the depletion control region includes a circular or sector-shaped region having a radius not less than t, wherein at least one of the drift layer in the depletion control region and the semiconductor substrate in a plan view parallel to the surface of the drift layer has at least one of a crystalline defect and a process-related defect, and a distance, in the plan view, from the at least one of the crystalline defect and the process-related defect to an outer edge of the depletion control region is not less than t, wherein the crystalline defect is a micropipe or an epitaxial defect.

2. The semiconductor device according to claim 1, wherein
   the first electrode makes the Schottky contact with the drift layer, and
   the semiconductor device is a Schottky barrier diode.

3. The semiconductor device according to claim 1, wherein
   the drift layer has a plurality of well regions in a surface part including a first principal surface, the well regions each include a source region,
   the semiconductor device comprises:
      a gate insulation layer which is on the first principal layer of the drift layer and exposes at least part of each of the source regions in the plurality of well regions;
      a gate electrode formed such that, outside the depletion control region, the gate electrode is on the gate insulation layer and such that, inside the depletion control region, the gate electrode is not on the gate insulation layer; and
      an insulation layer formed such that, outside the depletion control region, the insulation layer covers the gate electrode and such that, inside the depletion control region, the insulation layer covers at least part of the gate insulation layer, and
   outside the depletion control region, the first electrode covers the insulation layer.

* * * * *